United States Patent
Kim

[19]

[11] Patent Number: 6,165,904
[45] Date of Patent: Dec. 26, 2000

[54] POLISHING PAD FOR USE IN THE CHEMICAL/MECHANICAL POLISHING OF A SEMICONDUCTOR SUBSTRATE AND METHOD OF POLISHING THE SUBSTRATE USING THE PAD

[75] Inventor: Kyung-hyun Kim, Seoul, Rep. of Korea

[73] Assignee: Samsung Electronics Co., Ltd., Suwon, Rep. of Korea

[21] Appl. No.: 09/411,314

[22] Filed: Oct. 4, 1999

[30] Foreign Application Priority Data

Oct. 7, 1998 [KR] Rep. of Korea ...................... 98-41866

[51] Int. Cl.⁷ .................................................. H01L 21/302
[52] U.S. Cl. ............................................ 438/692; 156/345
[58] Field of Search ..................................... 438/692, 693; 216/88, 89; 156/345; 451/287, 288

[56] References Cited

U.S. PATENT DOCUMENTS

| | | | |
|---|---|---|---|
| 5,020,283 | 6/1991 | Tuttle | 451/550 |
| 5,297,364 | 3/1994 | Tuttle | 451/41 |
| 5,329,734 | 7/1994 | Yu | 451/527 |
| 5,888,121 | 3/1999 | Kirchner et al. | 451/41 |
| 5,984,769 | 11/1999 | Bennett et al. | 451/527 |

*Primary Examiner*—Thi Dang
*Attorney, Agent, or Firm*—Jones Volentine, LLC

[57] ABSTRACT

A polishing pad used for the chemical mechanical polishing (CMP) of a semiconductor substrate includes a polishing surface having at least first and second discrete polishing regions effecting differing amounts of polishing. Each polishing region includes at least one opening which holds the slurry that effects the chemical polishing of the substrate, and a contact surface left around the at least one opening which effects the mechanical polishing. The second polishing region has a ratio of the volume of the openings thereof with respect to unit area of the region which is different from the ratio of the volume of the openings of the first polishing region with respect to unit area of the first polishing region. When it is determined that a surface of a semiconductor substrate will become more or less polished at an outer peripheral region thereof than at its central portion as the entirety of the surface is being polished by the first polishing region of the polishing pad, a wafer carrier moves the substrate until the outer peripheral portion of the surface of the substrate lies against the second polishing region of the polishing pad, such that the surface can be polished uniformly.

43 Claims, 12 Drawing Sheets

POLISHING PAD FOR USE IN THE CHEMICAL/MECHANICAL POLISHING OF A SEMICONDUCTOR SUBSTRATE AND METHOD OF POLISHING THE SUBSTRATE USING THE PAD

BACKGROUND OF THE INVENTION

1. Field of the Invention

The present invention relates to semiconductor devices. More particularly, the present invention relates to a pad used for the chemical/mechanical polishing (CMP) of a semiconductor substrate.

2. Description of the Related Art

As semiconductor devices become more integrated, planarization processes are gaining more attention. A chemical/mechanical polishing (CMP) device is one type of apparatus used to carry out a planarization process. The CMP device is used for performing a global planarization of semiconductor devices. In this process, a surface of a semiconductor substrate is polished both mechanically and chemically. The mechanical polishing occurs due to contact between the semiconductor substrate and a polishing pad, whereas the chemical polishing is carried out by exposing the substrate to a slurry.

The CMP planarization process has drawbacks such as the high costs in running the process and the difficulty in achieving uniformity in the thickness of the polished surface of the semiconductor substrate. Irregularities in the thickness of the substrate occur due to a non-uniform distribution of the load applied to the semiconductor substrate while it is polished. Thus, CMP devices require a controller capable of precisely controlling load distribution.

Furthermore, the uniformity of polishing using CMP also depends on the speed of rotation of a carrier on which the semiconductor substrate is fixed, and the speed of rotation of a polishing table to which the polishing pad is fixed. With these factors present, the precision by which load distribution can be controlled is rather limited when polishing semiconductor substrates which have a diameter of about 150 mm and a thickness of between 1 $\mu$m and several hundreds of angstroms. In fact, non-uniformity in the thickness of such polished substrates is typically approximately 10%.

The polishing pad in CMP devices typically has a polishing surface in which a plurality of holes or grooves are uniformly formed. The holes or the grooves contain slurry supplied to the polishing pad and in turn supply the slurry to the interface between the semiconductor substrate and the polishing pad. Also, the effective polishing surface of the polishing pad, i.e., the portion of the pad actually contacting the semiconductor substrate, is determined by the holes or the grooves. Thus, the size or the form of the holes or the grooves has a great effect on the polishing property of the pad.

The holes or the grooves of the polishing pad are formed on central and peripheral regions of the pad, as well as along a track where the polishing pad runs in contact with the semiconductor substrate. Thus, it is difficult to compensate for irregular polishing in which the center of the semiconductor substrate and the periphery of the substrate are polished to different extents. Even if the semiconductor substrate is moved off of the track, irregular polishing cannot be compensated for because the grooves or holes are configured uniformly over the surface of the polishing pad.

SUMMARY OF THE INVENTION

It is an object of the present invention to provide a polishing pad which can be used to uniformly mechanically and chemically polish a semiconductor substrate.

To achieve this object, the polishing pad of the present invention has a polishing surface having discrete regions designed to effect different amounts of polishing when employed by a CMP device. The polishing surface includes a first polishing region having at least one opening therein for holding slurry, and a second polishing region also having at least one opening therein for holding slurry. The ratio of the volume of openings to the area in the second polishing region is different from the ratio of the volume of openings to the area in the first polishing region.

The openings can be in the form of holes or grooves. The depths, widths and/or spacing between the holes or grooves can differ amongst the polishing regions to account for the difference in the ratios of volume of the openings to area.

The polishing surface of the pad may also have a third discrete polishing region having, like the first and second polishing regions, at least one opening therein. The at least one opening in the third polishing region is configured so that the ratio of the openings with respect to the area of the third polishing region is different from that associated with the first polishing region.

Another object of the present invention is to provide a method of polishing a semiconductor substrate wherein any irregularity in polishing, that is known to occur when the substrate is polished in a polishing region having uniform characteristics, can be compensated for.

To achieve this object, the method of the present invention includes steps of fixing the semiconductor substrate to a semiconductor carrier, attaching the polishing pad described above to a polishing table across from the semiconductor substrate, subsequently pressing a surface of the semiconductor substrate against only the first polishing region of the polishing surface of the polishing pad, introducing a slurry into the openings in the polishing regions of the pad, rotating the polishing pad and the semiconductor substrate relative to one another to initially polish the semiconductor substrate with the first polishing region of the pad, and subsequently moving only the outer peripheral portion of the surface of the semiconductor substrate onto the second polishing region of the polishing pad.

Because the outer peripheral portion of the surface of the semiconductor substrate is polished at a different rate at the second polishing region than when it was being polished at the first polishing region, a predetermined irregularity between the amount of polishing that is effected at a central portion and at the outer peripheral portion of the surface of the semiconductor substrate can be compensated for.

DESCRIPTION OF THE DRAWINGS

The above and other objects, features and advantages of the present invention will become more apparent from the following detailed description of preferred embodiments thereof made with reference to the attached drawings of which.

DETAILED DESCRIPTION OF THE PREFERRED EMBODIMENTS

Figure 1:
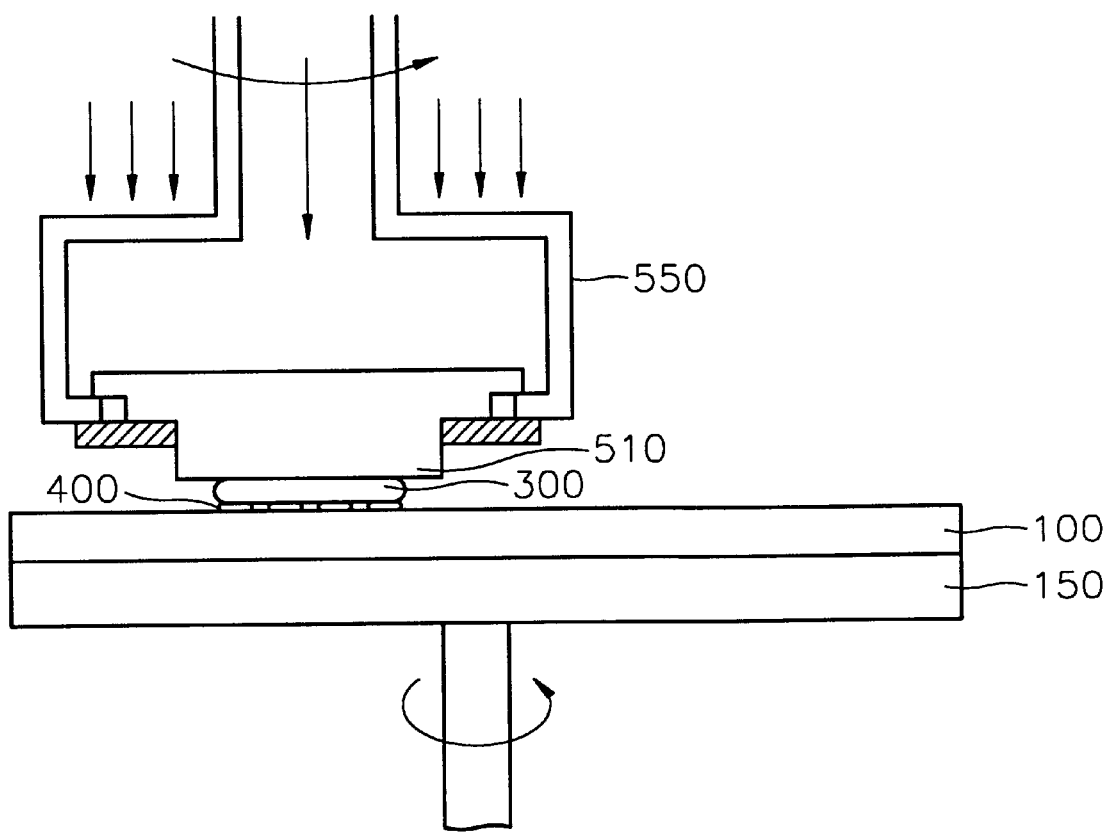
FIG. 1 is a schematic view of a chemical mechanical polishing device.

The present invention will now be described more fully with reference to the accompanying drawings, in which preferred embodiments of the invention are shown. In the drawings, the shapes and sizes of elements and regions are exaggerated for clarity.

As shown in FIG. 1, a CMP apparatus includes a polishing table 150 and a carrier 550. A polishing pad 100 is attached to the entire surface of the polishing table 150 such that the polishing surface of the pad faces the surface of a semiconductor substrate 300. The polishing pad 100 is rotated by rotating the polishing table 150 at a predetermined speed.

The semiconductor substrate 300 is fixed to a carrier base 510 of the carrier 550 with a surface of the semiconductor substrate 300 to be polished facing the surface of the polishing pad 100. The carrier 550 can rotate, move horizontally or oscillate so that the semiconductor substrate 300 is rotated or moved. Also, a load is applied to the carrier 550 to press the surface of the semiconductor substrate 300 against the polishing surface of the polishing pad 100.

The semiconductor substrate 300 is chemically and mechanically polished by rotating the polishing table 150, rotating and moving the carrier 550, and by supplying a chemical abrasive such as slurry 400 between the substrate 300 and the polishing surface of the polishing pad 100.

During polishing, the semiconductor substrate 300 is pressed against the first polishing region of the polishing surface of the polishing pad 100.

As the semiconductor substrate 300 is being polished, the surface of the semiconductor substrate 300 may become irregular due to non-uniformity in the pressure applied to the semiconductor substrate 300 or due to the state of the surface of the semiconductor substrate 300. For instance, an outer peripheral portion of the surface of the semiconductor substrate 300 may be polished more or less than the center thereof.

When irregular polishing occurs, the carrier 550 is oscillated or is horizontally moved with respect to the polishing pad so that the outer peripheral portion of the surface of the semiconductor substrate 300 is moved from the first polishing region to a second polishing region. This changes the polishing conditions so that the irregular polishing can be compensated for.

For example, when the surface of the semiconductor substrate 300 is covered with an oxide layer, the outer peripheral portion of the surface of the substrate 300 often becomes more polished than the center thereof. In such a case, the first polishing region is designed to produce a higher amount of polishing than the second polishing region.

For instance, the first holes or grooves of the first polishing region are deeper than the second holes or grooves of the second polishing region, the first holes or grooves of the first polishing region are wider than the second holes or grooves of the second polishing region, or the spacing between the first holes or grooves of the first polishing region is less than that between the second holes or grooves of the second polishing region. In these cases, more slurry is supplied to the first polishing region than the second polishing region.

When the outer peripheral portion of the surface of the semiconductor substrate 300 is moved to the second polishing region by the carrier 550, less of a chemical reaction occurs at the outer peripheral portion than at the center of the surface of the semiconductor substrate 300 because there is less slurry at the second polishing region than there is at the first polishing region. Thus, continued polishing at the outer peripheral portion of the surface of the substrate 300 is suppressed. Accordingly, the surface of the semiconductor substrate 300 can be polished uniformly in the end.

On the other hand, if the polishing tends to be less at the outer peripheral portion of the surface of the substrate 300 than at the center thereof, the polishing pad 100 is designed to compensate for such uneven polishing, i.e., the second polishing region is designed to polish to a higher degree than the first polishing region.

The situations described above are based on the assumption that when the amount of slurry is increased and other polishing conditions are the same, the polishing of the oxide layer is increased. However, under some situations in which the amount of slurry is increased and other polishing conditions are changed, the polishing can actually decrease. Differences between the form of the first holes and the form of the second holes result in different partial pressures arising or different contact areas existing between the first and second polishing regions of the pad. In can thus be understood that the present invention is useful in either of the situations referred to above by producing different amounts of polishing at the first and second regions thereof. Generally speaking, in the present invention, the polishing pad has regions having different volumes per unit area (total volume of openings in the surface of the region per total area of the region).

Figure 2:
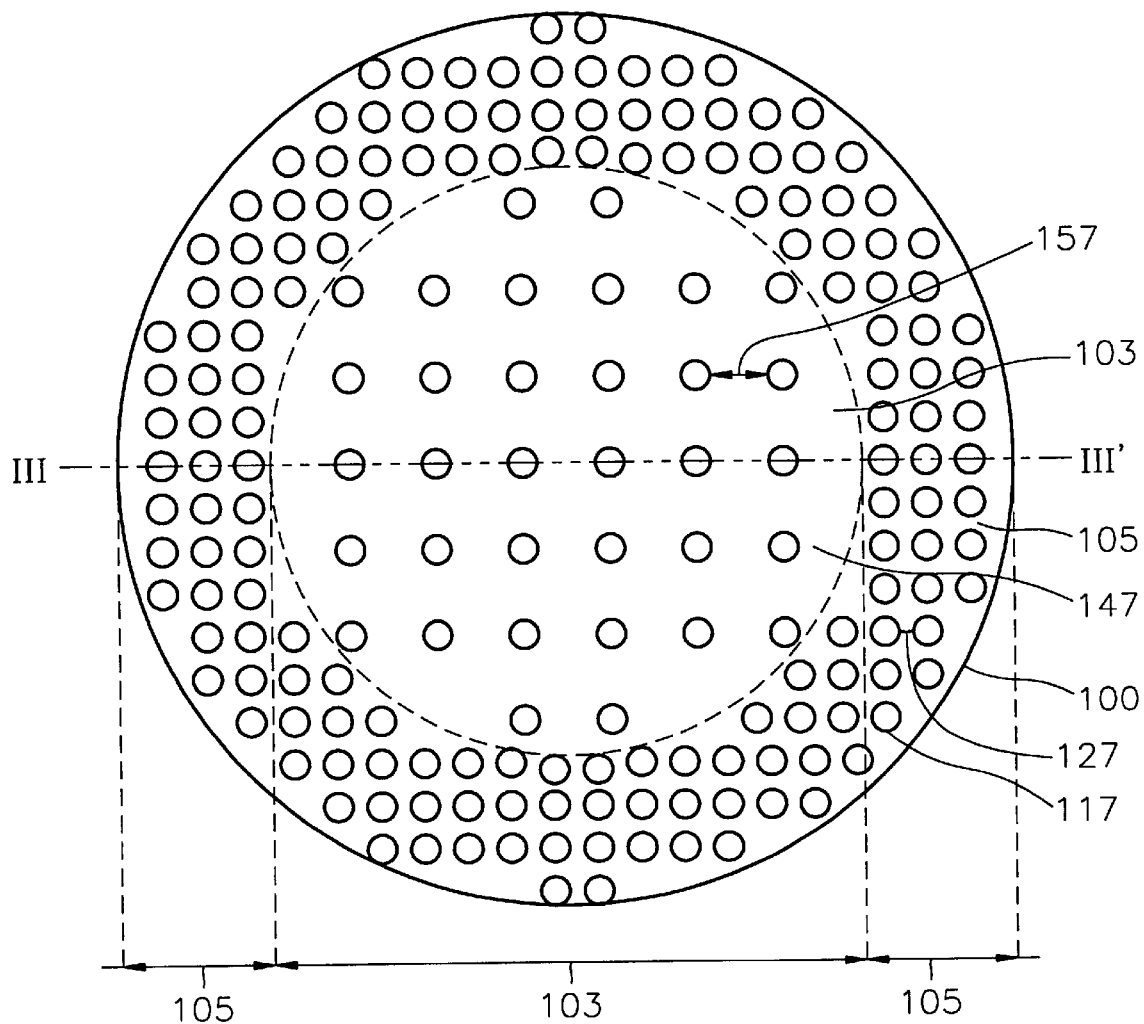
FIG. 2 is a plan view of the first embodiment of a polishing pad according to the present invention.
Figure 3:
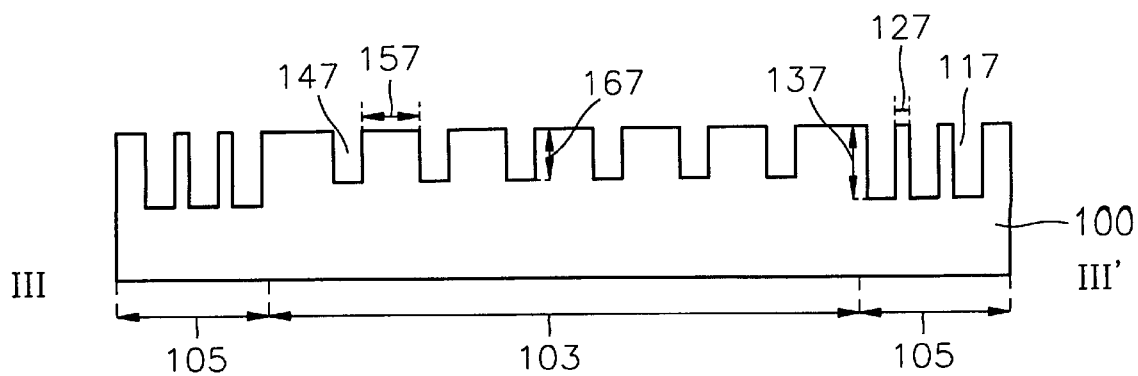
FIG. 3 is a cross-sectional view of the first embodiment of the polishing pad taken along line III–III' in FIG. 2.

FIGS. 2 and 3 are a plan view and a sectional view, respectively, of the first embodiment of a polishing pad according to the present invention.

In this embodiment, a disc-like polishing pad 100 has a top polishing surface on which various regions are defined. For instance, a first polishing region 103 encompasses a central area of the polishing surface, and a second polishing region 105 is located radially outwardly of and directly adjacent the first polishing region 103. That is, the first polishing region 103 can be thought of as that region located between a first radially extending line segment and a second larger radially extending line segment (preferably, there is no first radially extending line segment so that the first region encompasses the exact center of the disc). The second polishing region 105, therefore, is that region defined between the second radially extending line segment and a larger third radially extending line segment, such as the radius of the disc.

Preferably, the first polishing region 103 is as wide as the semiconductor substrate. A plurality of first holes 147 are formed in the first polishing region 103. The first holes 147 have a first width, a first depth 167 and are spaced from each other by a first distance 157. Also, a plurality of second holes 117 are formed in the second polishing region 105. The second holes 117 have a second width, a second depth 137 and are spaced apart by a second distance 127.

Referring to FIGS. 2 and 3, the form of the first holes 147 is different from that of the second holes 117. For instance, the first holes 147 are shallower than the second holes 117, have a width equal to or less than that of the second holes 117, and/or have a first spacing 157 greater than the second spacing 127 of the second holes 117. Also, the number of first holes 147 per unit area in the first polishing region 103 is less than that of the number of second holes 117 per unit area in the second polishing region 105.

Thus, the volume of the first holes 147 per unit area of the first polishing region 103 is smaller than the volume of the second holes 117 per unit area of the second polishing region. This means that less slurry will fill the first holes 147 than the second holes 117. Thus, less slurry will be applied to the surface of the semiconductor substrate 300 contacting the first polishing region 103 than that contacting the second polishing region 105. Accordingly, if all other conditions of polishing are identical, a surface of a semiconductor substrate contacting the second polishing region 105 will be polished more than a surface contacting the first polishing region 103.

Thus, in the embodiment of FIG. 1, after the semiconductor substrate 300 is polished for a while in the first polishing region 103, the carrier 550 is moved horizontally or is oscillated to bring the outer peripheral portion of the surface of the substrate 300 into the second polishing region 105. When the outer peripheral portion of the semiconductor substrate 300 extends over the second polishing region 105, it is polished more than the center of the substrate. Thus, a discrepancy between the polishing of the central and outer peripheral portions of the surface of the substrate 300 can be compensated for.

Moreover, the area of the polishing surface in the first region 103 is greater than the area of the polishing surface existing in the second polishing region 105. Thus, mechanical polishing will occur at a greater rate in the first polishing region 103. The total amount of polishing that occurs in each of the respective regions is based on the amount of slurry in the region (the chemical polishing) and the mechanical polishing.

Also, the depth 167 of the first holes 147 is less than the depth 137 of the second holes 147. If the widths and the spacings of the first 147 and second 117 holes are otherwise identical, the pressure created at the contact area in the second polishing region 105 is greater than that created at the contact area in the first polishing region 103. Thus, the depths of the holes can account for different amounts of polishing occurring in the first 103 and second 105 polishing regions.

Figure 4:
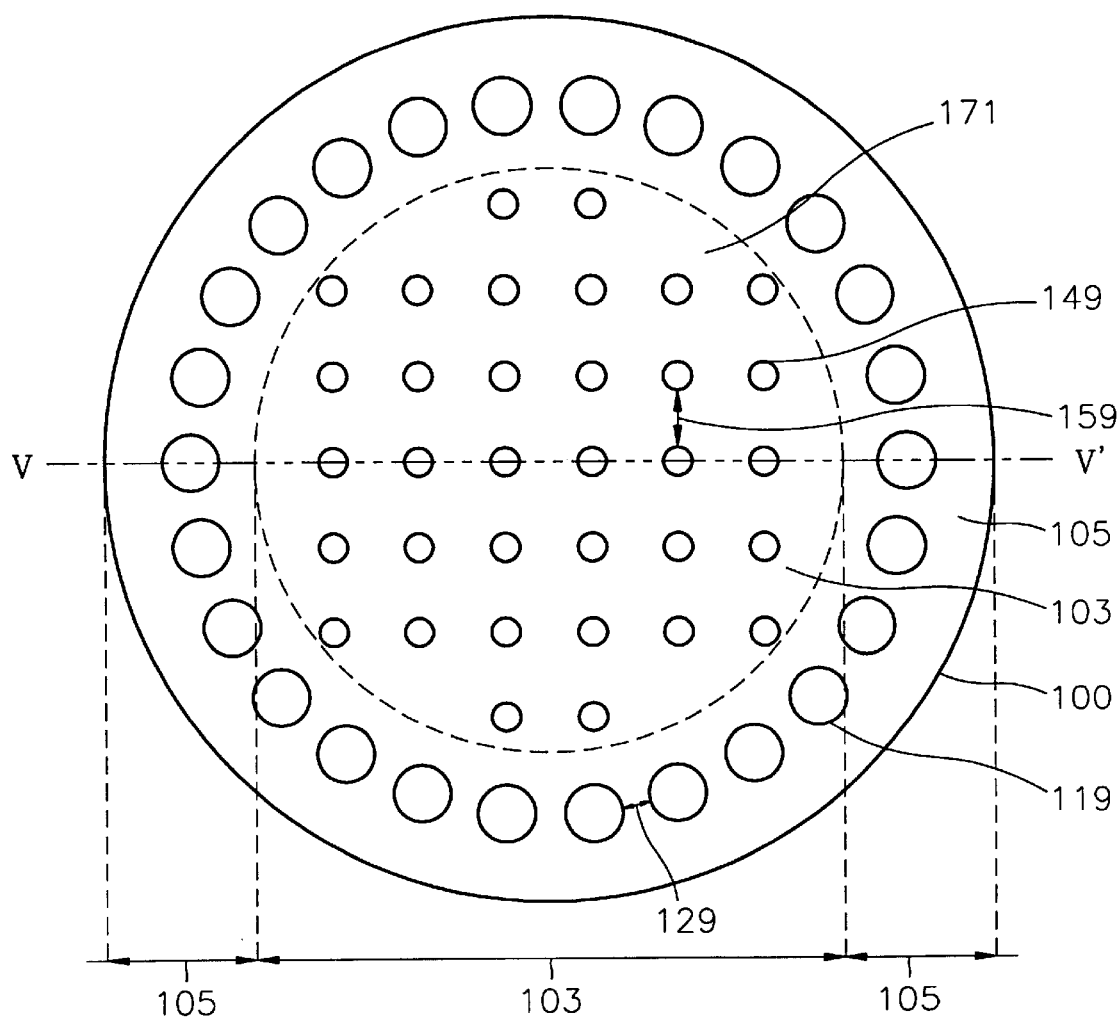
FIG. 4 is a plan view of the second embodiment of a polishing pad according to the present invention.
Figure 5:
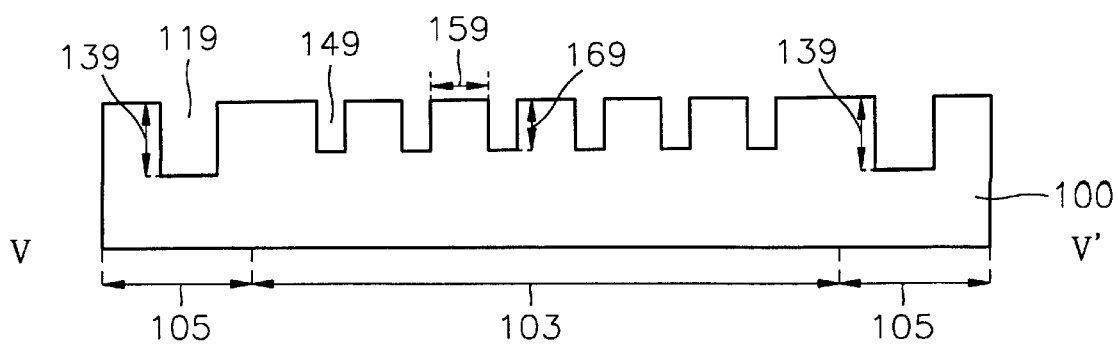
FIG. 5 is a cross-sectional view of the second embodiment of the polishing pad taken along line V–V' in FIG. 4.

FIGS. 4 and 5 are a plan view and a sectional view, respectively, of a second embodiment of the polishing pad according to the present invention.

In this embodiment, the second holes 119 have a depth 139, a width and are spaced apart by a second distance 129. The depth 139 of the second holes 119 may be equal to or greater than the depth 169 of the first holes 149. Also, when the number of second holes 119 per unit area is equal to the number of first holes 149 per unit area, the second holes 119 are designed to be wider than the first holes 149 in which case the second spacing 129 is smaller than the first spacing 159.

Figure 6:
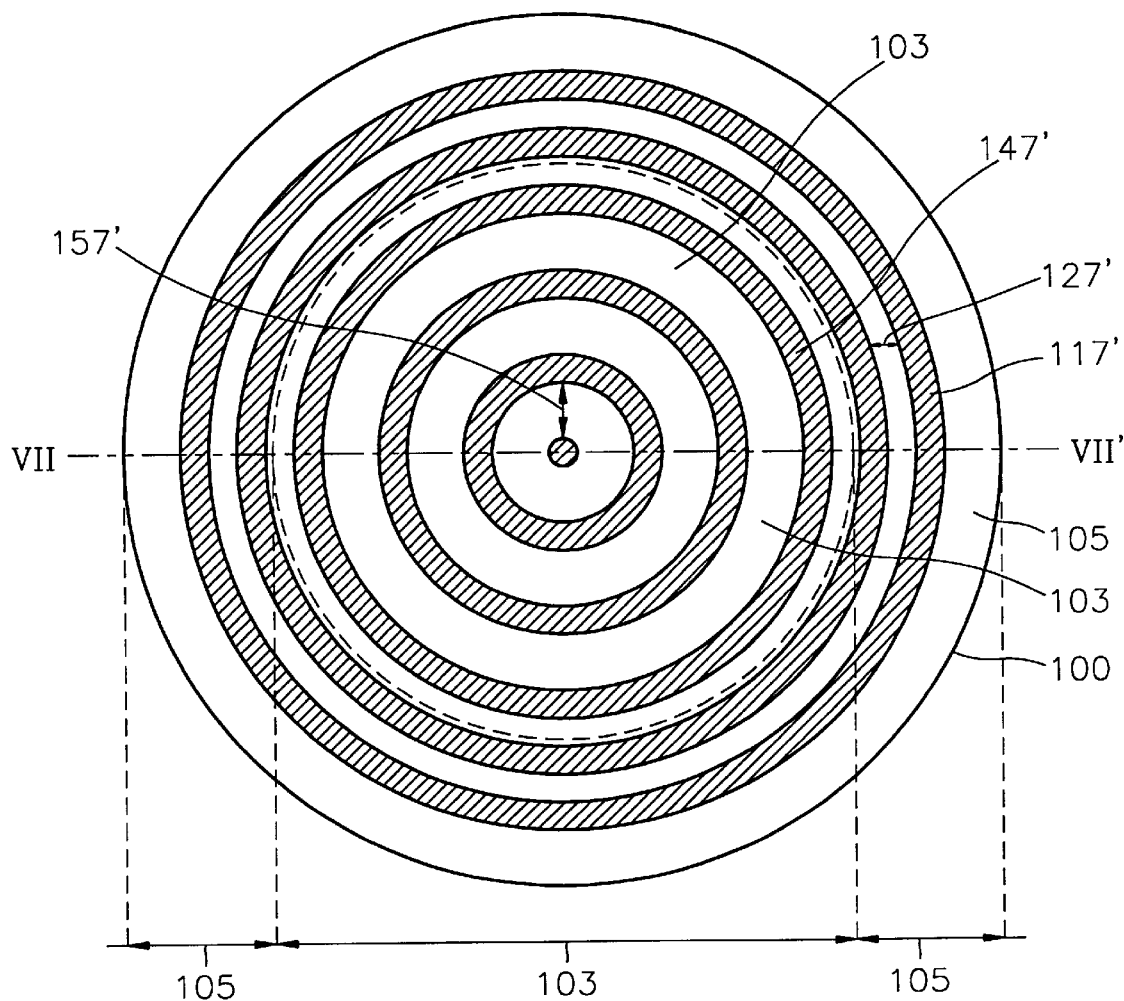
FIG. 6 is a plan view of the third embodiment of a polishing pad according to the present invention.
Figure 7:
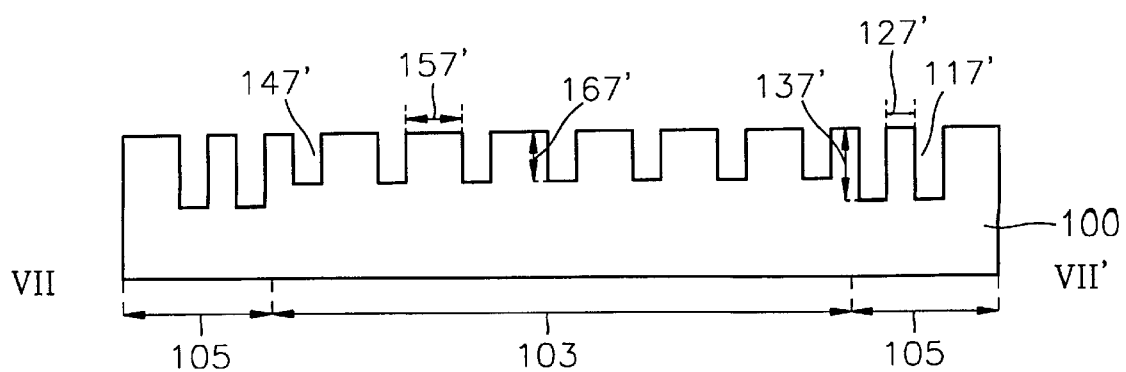
FIG. 7 is a cross-sectional view of the third embodiment of the polishing pad taken along line VII–VII' in FIG. 6.

FIGS. 6 and 7 are a plan view and a sectional view, respectively, of a third embodiment of the polishing pad according to the present invention.

In the third embodiment, grooves instead of holes are formed in the polishing surface. More specifically, the first polishing region 103 includes a surface in which a plurality of first grooves 147' are formed as spaced apart by a first distance 157'. Each of the first grooves 147' has a first depth 167' and a first width. The second polishing region 105 includes a plurality of second grooves 117' spaced apart by a second distance 127'. Each of of the second grooves 117' has a second depth 137' and a second width. The first grooves 147' are different from the second grooves 117'. For instance, the first grooves 147' are shallower than the second grooves 117'. The width of the first grooves 147' is equal to or less than the width of the second grooves 117'. The spacing of the first grooves 147' is greater than the spacing' of the second grooves 117'. The number of first grooves 147' per unit area is less than the number of second grooves 117' per unit area.

Thus, as with the first embodiment, the volume ratio with respect to unit area in the first polishing region 103 is lower than that in the second polishing region 105. Thus, less chemical polishing occurs in the first polishing region 103 than in the second polishing region 105. Assuming that other conditions of polishing are identical, more polishing occurs in the second polishing region 105 than in the first polishing region 103. Therefore, irregular polishing can be compensated for by oscillating or moving the carrier 550 (of FIG. 1) to bring the outer peripheral portion of the surface of the semiconductor substrate into the second polishing region 105.

Figure 8:
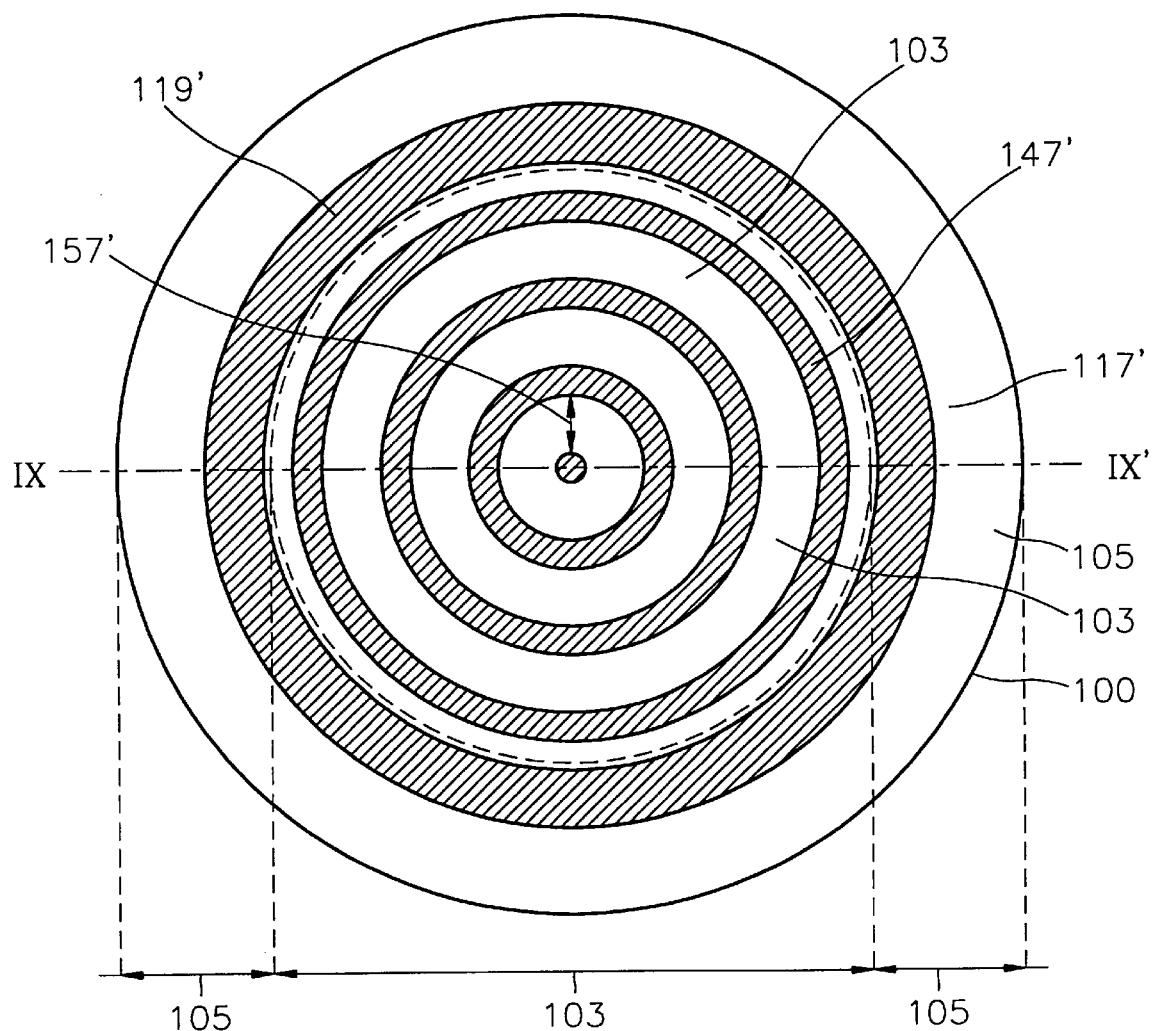
FIG. 8 is a plan view of the fourth embodiment of a polishing pad according to the present invention.
Figure 9:
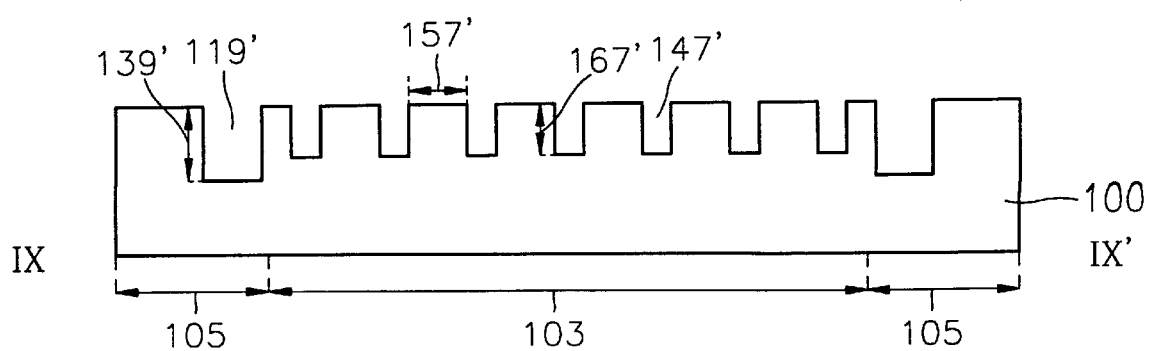
FIG. 9 is a cross-sectional view of the fourth embodiment of the polishing pad taken along line IX–IX' in FIG. 8.

FIGS. 8 and 9 are a plan view and a sectional view, respectively, of a fourth embodiment of the polishing pad of the present invention.

In this embodiment, grooves are formed in the first polishing region 103 and a single groove 119' is formed in the second polishing region 105. The depth 139' of the groove 119' may be equal to or greater than the depth 167' of the first grooves 147'. In a modified form in which the number of second grooves 119' per unit area in the second polishing region 105 is designed to be equal to the number of first grooves 147' per unit area in the first polishing region 103, the second grooves 119' are wider than the first grooves 147' and the second spacing is smaller than the first spacing 157'. The polishing that occurs in the second polishing region 105 will be different than that which occurs in the first polishing region 103.

Figure 10:
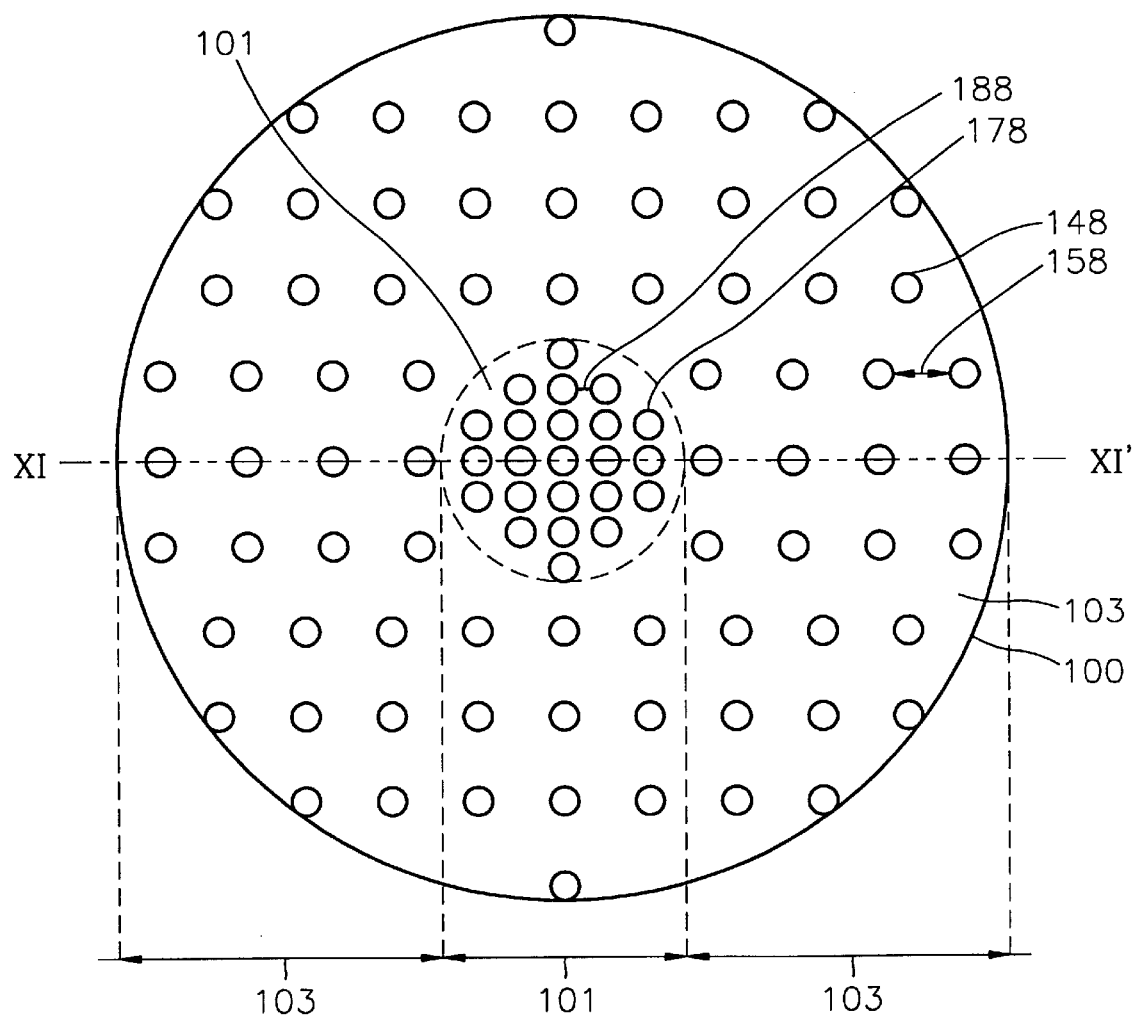
FIG. 10 is a plan view of the fifth embodiment of a polishing pad according to the present invention.
Figure 11:
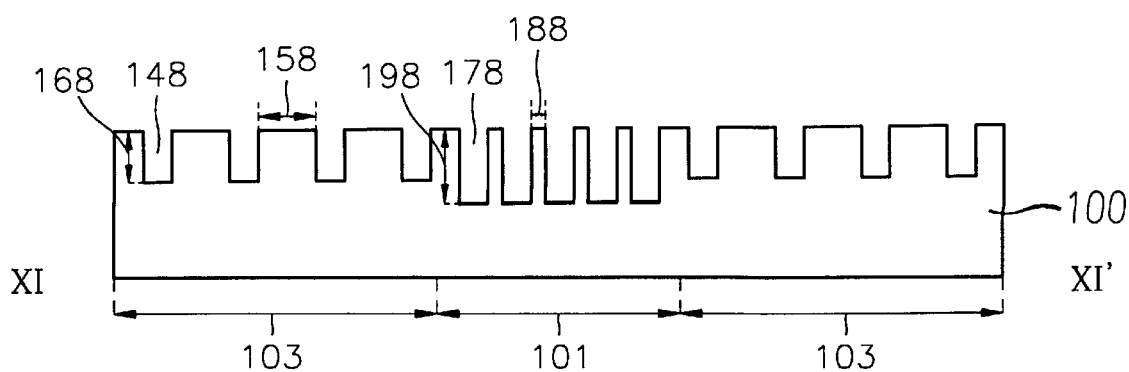
FIG. 11 is a cross-sectional view of the fifth embodiment of the polishing pad taken along line XI–XI' in FIG. 10.

FIGS. 10 and 11 are a plan view and a sectional view, respectively, of a fifth embodiment of the polishing pad according to the present invention. In this embodiment, the first polishing region 103 encompasses the outer peripheral portion of the polishing surface of the disc, whereas the second polishing region 101 is formed directly adjacent the first polishing region 103 and encompasses a central portion of the polishing surface of the disc. The semiconductor substrate 300 (shown in FIG. 1) will thus be initially brought into contact with the first polishing region 103.

The first polishing region 103 can be thought of as a region of the disc lying between ends of first and second radially extending line segments, the second radially extending line segment being smaller than the first. The first radially extending line segment can extend all the way to the outer peripheral edge of the disc. The second polishing region 101, therefore, is a region lying between ends of the second radially extending line segment and a third radially extending line segment which is smaller than the second. Preferably, there is no third radially extending line segment so that the second polishing region encompasses the exact center of the polishing surface of the disc.

The second polishing region 101 has holes 178 that are deeper, as wide or narrower than, and/or are spaced closer together than the holes 148 of the first polishing region 103. That is, the depth 68 of the holes 148 of the first polishing region 103 is less than the depth 198 of the second holes 178. The width of the first holes 148 is equal to or less than the width of the second holes 178. The first spacing 158 is greater than the second spacing 188. The number of first holes 148 per unit area of the polishing surface in the first polishing region 103 is less than the number of second holes 178 per unit area of the polishing surface in the second polishing region 101.

In each of these first through fifth embodiments, the holes or grooves are configured so that the first volume ratio per unit area of the first polishing region is less than the second volume ratio per unit area of the second polishing region 105 or 101. However, the holes or grooves could be configured symmetrically to those of the first through fifth embodiments so that the first volume ratio per unit area of the first polishing region is greater than the second volume ratio per unit area of the second polishing region 105 or 101. In this case, a smaller amount of polishing will be effected in the second polishing region 101 than in the first. Such a polishing pad can compensate for excessive polishing of the outer periphery of the semiconductor substrate 300. If the outer periphery is polished excessively while the semiconductor substrate 300 is in contact with the surface of the disc of the first polishing region, the semiconductor substrate 300 can be moved until its outer periphery lies over the second polishing region.

Figure 12:
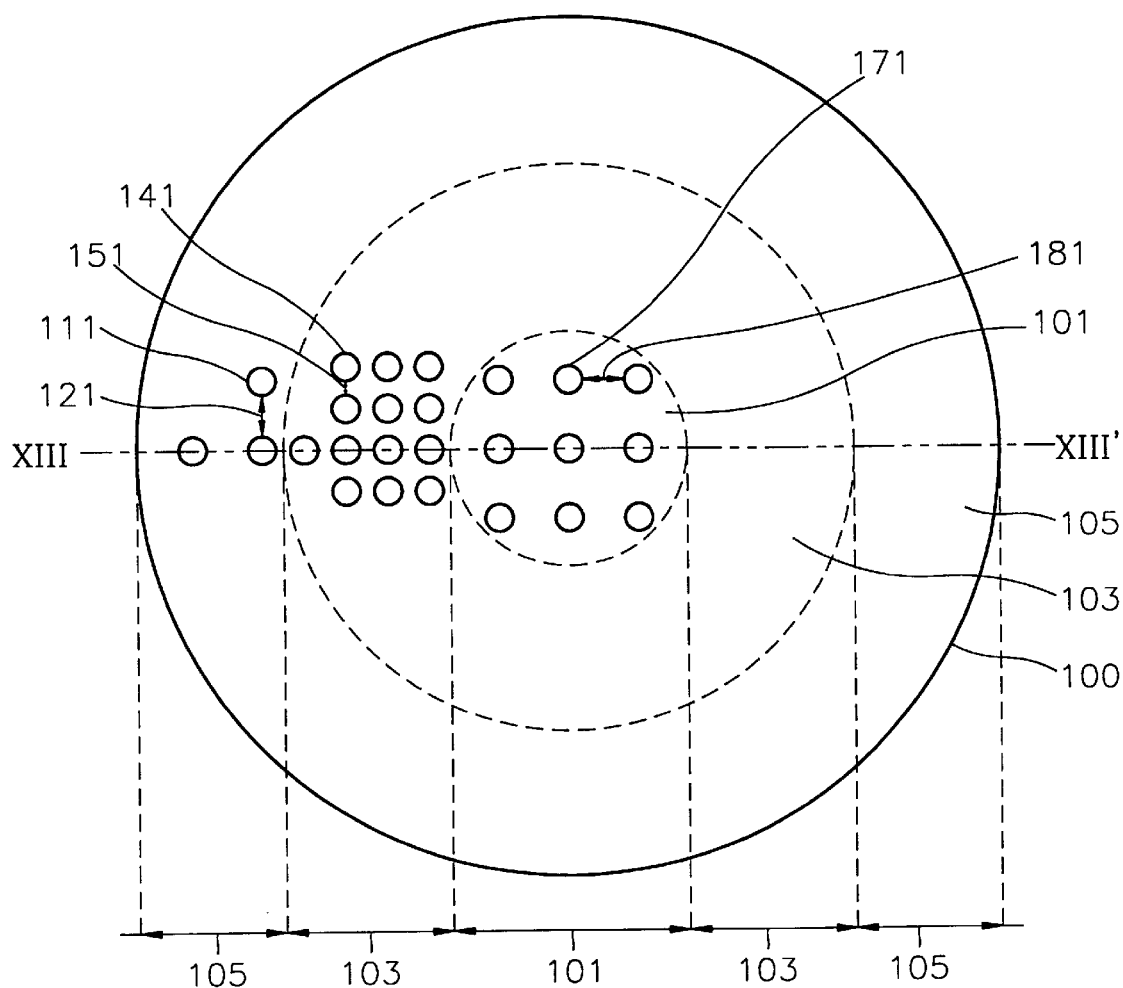
FIG. 12 is a plan view of the sixth embodiment of a polishing pad according to the present invention.
Figure 13:
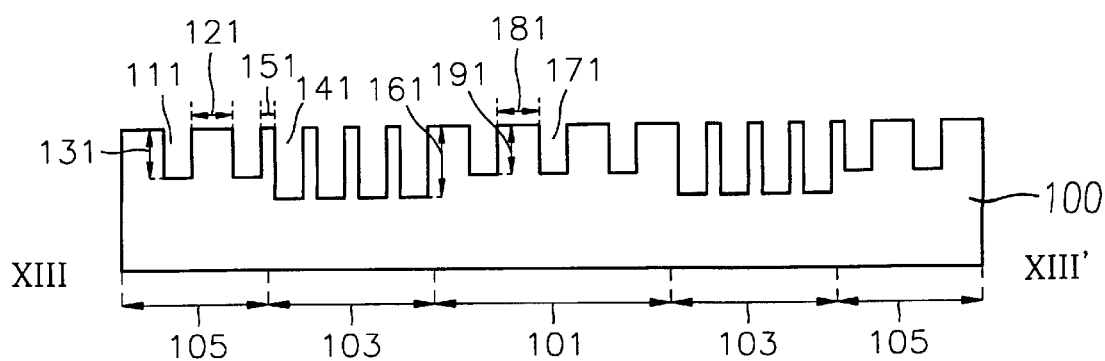
FIG. 13 is a cross-sectional view of the sixth embodiment of the polishing pad taken along line XIII–XIII' in FIG. 12.

FIGS. 12 and 13 are a plan view and a sectional view, respectively, of a sixth embodiment of the polishing pad according to the present invention.

In this embodiment, three discrete polishing regions are formed: a second polishing region 105 at the outer periphery of the disc, a first polishing region 103 (the track along which the semiconductor substrate 300 is initially polished), and a third polishing region 101 directly adjacent the first polishing region 103 and occupying a central portion of the polishing surface of the disc. A plurality of holes are formed at the second polishing region 105, the first polishing region 103 and the third polishing region 101. The configuration of these holes dictates the amount of polishing which will occur in each of the regions. Preferably, the third polishing region 101 produces the same degree of polishing as the second polishing region 105. However, the holes may be configured so that different amounts of polishing will occur in each of the three polishing regions.

More specifically, a plurality of second holes 111 having a certain depth 131, width and spacing 121 are formed in the surface of the second polishing region 105. The dimensions of the second holes 111 are different from those of the holes 141 (and/or 171) in the first polishing region 103 and/or the third polishing region 101. That is, the depths, the spacing and/or the widths of the holes may be different among the three polishing regions. For instance, the depths may be identical, but the spacings and the widths may be different. On the other hand, the widths and the spacings could be identical, but the depths may be different.

Moreover, the number of holes per unit area of the polishing surface may vary amongst the regions or from region to region. Accordingly, the volume ratio with respect to the unit area of the first polishing region 103 is different from the volume ratio with respect to the unit area of the second polishing region 105 and/or the volume ratio with respect to the unit area of the third polishing region 101.

Referring to the specific form of the embodiment shown in FIG. 12, the depth 161 of the holes 141 of the first polishing region 103 is greater than the depth 131 of the holes 111 of the second polishing region 105 and the depth 191 of the holes 171 of the third polishing region 101. Thus, the volumes of the first holes 141 are different from the volumes of the second holes 111 and of the third holes 171 so that the amounts of slurry that will fill the first holes will be different. Thus, the amounts of slurry supplied in the first polishing region 103 to the surface of the semiconductor substrate 300 will be different, i.e., the amount of chemical polishing that occurs will be different. Also, partial pressures due to load applied to the polishing pad 100 are different. Thus, different amounts of mechanical polishing will occur in the regions.

Also, the width of the holes 141 in the first polishing region 103 is equal to the width of the holes 111 in the second polishing region and the width of the holes 171 in the third polishing region. However, the first spacing 151 is smaller than the second spacing 121 and the third spacing 181. The number of first holes 141 per unit area of the polishing surface in the first polishing region 103 is more than that of the number of holes 111 per unit area of the polishing surface in the second polishing region 105 and the number of holes 171 per unit area of the polishing surface in the third polishing region 101.

The second holes 111, the first holes 141 and the third holes 171 are formed at regular intervals in the second polishing region 105, the first polishing region 103 and the third polishing region 101, respectively. The boundary between the second polishing region 105 and the first polishing region 103 is designed to offer a smooth transition between the second holes 111 and the first holes 141 having different depths 131/161 and spacings 121/151. Similarly, the boundary between the first polishing region 103 and the third polishing region 101 is designed to offer a smooth transition between the first holes 141 and the third holes 171 also having different depths 161/191 and spacings 151/181. Thus, the amount of polishing which occurs does not undergo sharp changes in the boundaries between the polishing regions.

In the embodiment shown in FIGS. 12 and 13, the ratio of volume of holes per unit of area of the first polishing region 103 is higher than both the ratio of volume of holes per unit of area of the second polishing region 105 and the ratio of the volume of holes per unit of area of the third polishing region 101. Thus, relatively more slurry is supplied at the first polishing region 103 to the contact surface of the semiconductor substrate 300. Consequently, chemical polishing is effected at a higher rate in the first polishing region 103.

Accordingly, when the semiconductor substrate 300 is being polished at the first polishing region 103 and if its outer periphery becomes polished to a greater extent than its center, the outer periphery of the semiconductor substrate 300 can be moved horizontally to or oscillated over the second polishing region 105, to thereby compensate for the irregularities in the polishing.

Figure 14:
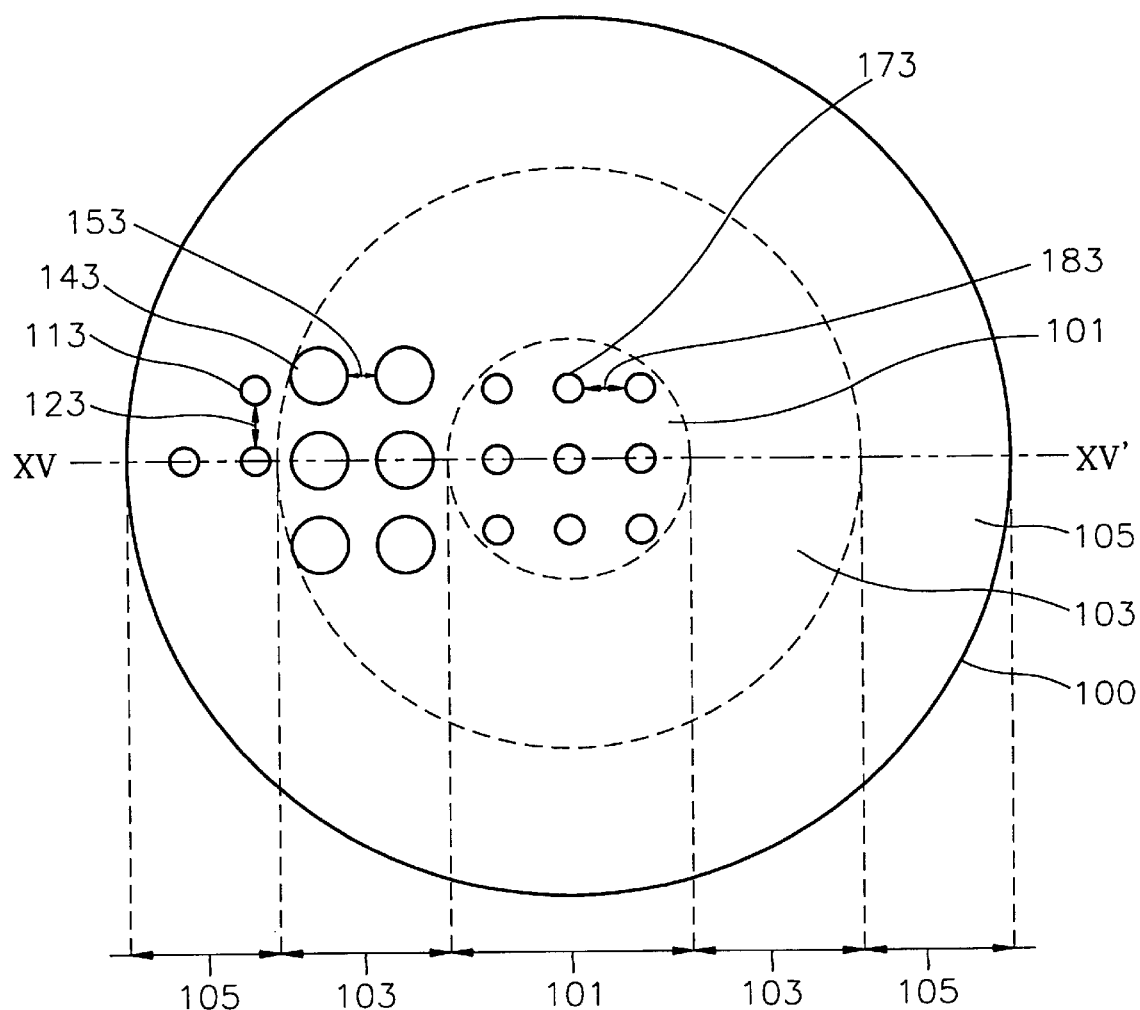
FIG. 14 is a plan view of the seventh embodiment of a polishing pad according to the present invention.
Figure 15:
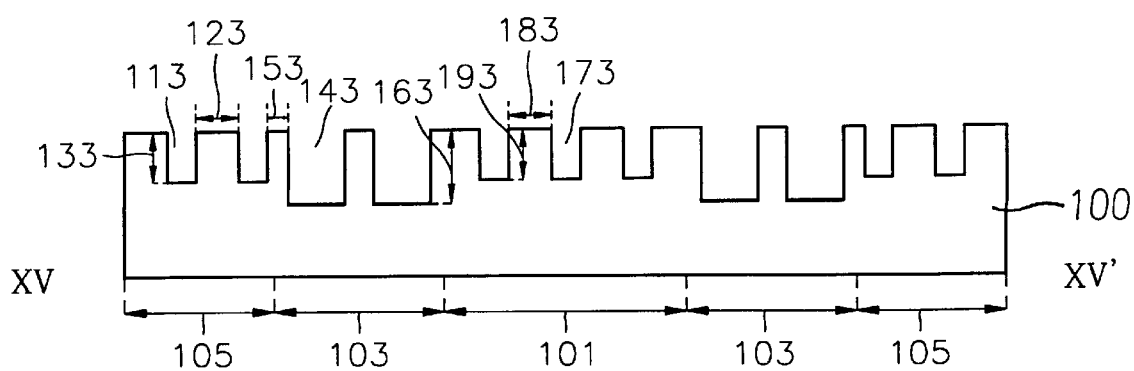
FIG. 15 is a cross-sectional view of the seventh embodiment of the polishing pad taken along line XV–XV' in FIG. 14.

FIGS. 14 and 15 are a plan view and a sectional view, respectively, of a seventh embodiment of the polishing pad according to the present invention.

In this embodiment, the depth 133 of the holes 113 in the second polishing region 105 and/or the depth 193 of the holes 173 in the third polishing region 101 can be equal to or less than the depth 163 of the holes 143 in the first polishing region 103. The number of second holes 113 and third holes 173 per unit area can be greater or less than the number of first holes 143 per unit area with respect to each of the polishing regions. Also, when the number of second and third holes 113 and 173 per unit area is equal to the number of first holes 143 per unit area, the second holes 113 and/or the third holes 173 are narrower than the first holes 143, and the spacing 123 of the second holes 113 and/or the spacing 183 of the third holes 173 is greater than the spacing 153 of the first holes 143.

Different amounts of chemical or mechanical polishing may be effected at the second polishing region 105 and the third polishing region 101 than at the first polishing region 103. For instance, a smaller volume of slurry may be held at the second 105 and/or third 101 polishing region than at the first polishing region 103. Thus, an excessive amount of polishing occurring at the outer peripheral portion of the substrate 300 as it is being polished in the first polishing region 103 can be compensated for by moving or oscillating the outer peripheral portion of the substrate to the second 105 and/or third 101 polishing region.

Figure 16:
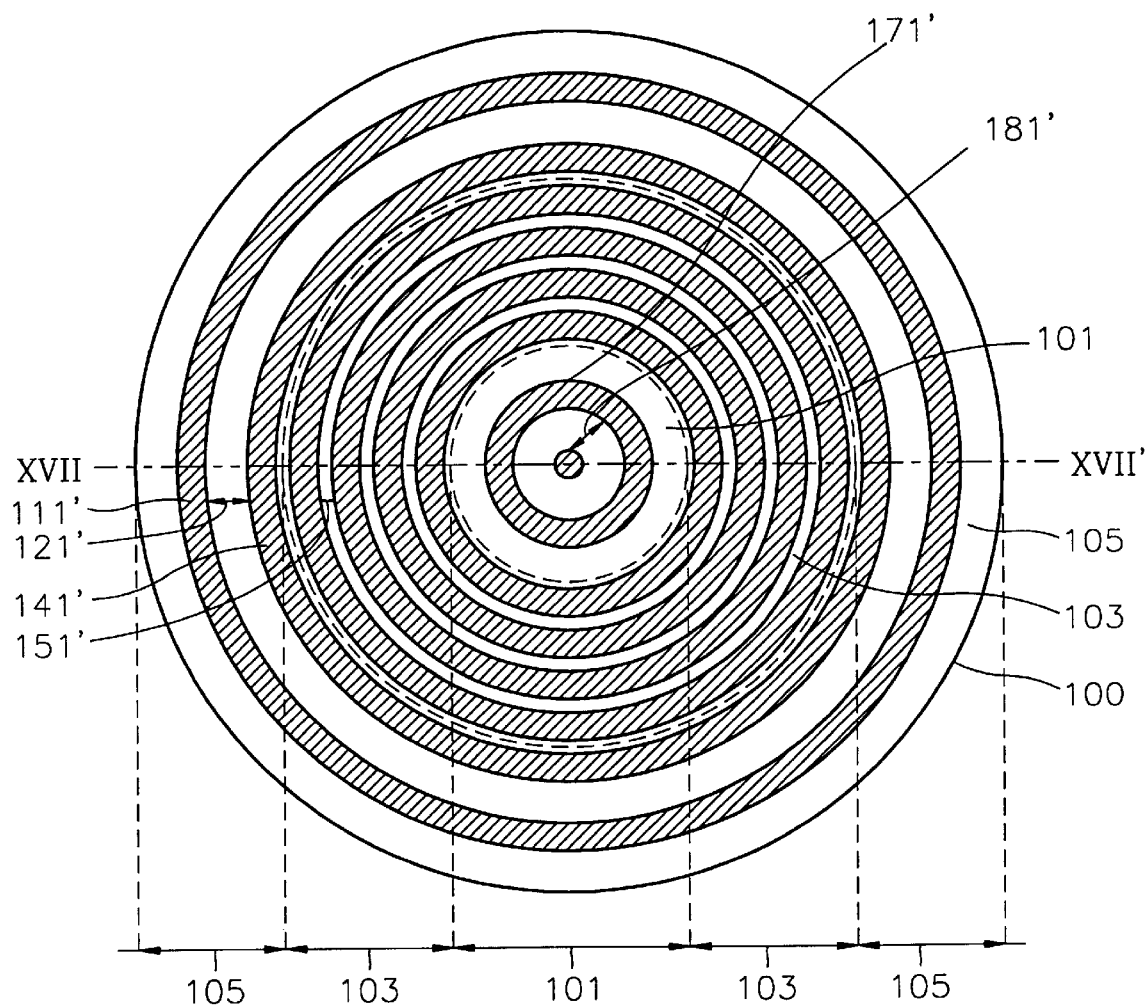
FIG. 16 is a plan view of the eighth embodiment of a polishing pad according to the present invention.
Figure 17:
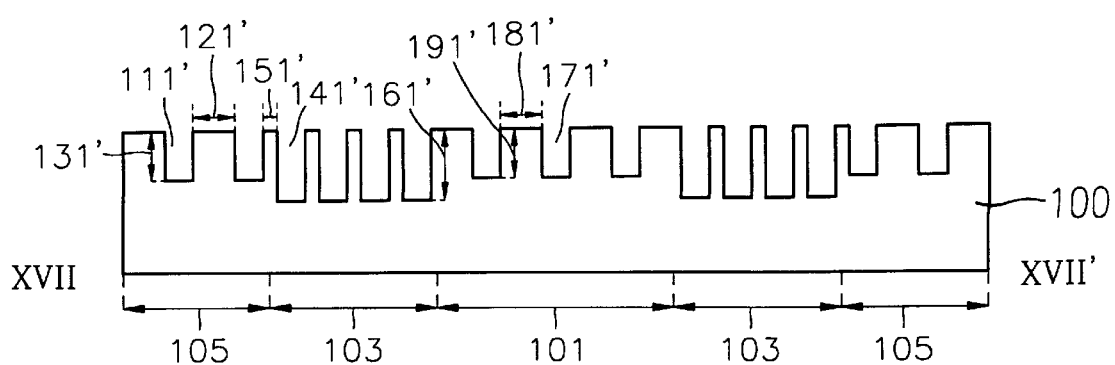
FIG. 17 is a cross-sectional view of the eighth embodiment of the polishing pad taken along line XVII–XVII' in FIG. 16.

FIGS. 16 and 17 are a plan view and a sectional view, respectively, of an eighth embodiment of the polishing pad according to the present invention.

In this embodiment, grooves are formed in the polishing surface of the disc. That is, a plurality of second grooves 111' having a second depth 131', a second width and a second spacing 121' are formed in the second polishing region 105. A plurality of first grooves 141' having a first depth 161', a first width and a first spacing 151' are formed in the first polishing region 103. And, a plurality of third grooves 171' having a third depth 191', a third width and a third spacing 181' are formed in the third polishing region 101.

The first grooves 141' are different from the second grooves 111' and/or the third grooves 171'. For instance, the first grooves 141' are deeper than the second 111' and/or third grooves 171'. The first grooves 141 are wider than the second grooves 111' and the third grooves 171'. The first spacing 151' is smaller than the second spacing 121' and the third spacing 181'. The number of first grooves 141' per unit area in the first polishing region is greater than that of the second grooves 111' and/or the third grooves 171'.

Thus, the amount of polishing that is effected varies from region to region so that irregular polishing can be compensated for.

Figure 18:
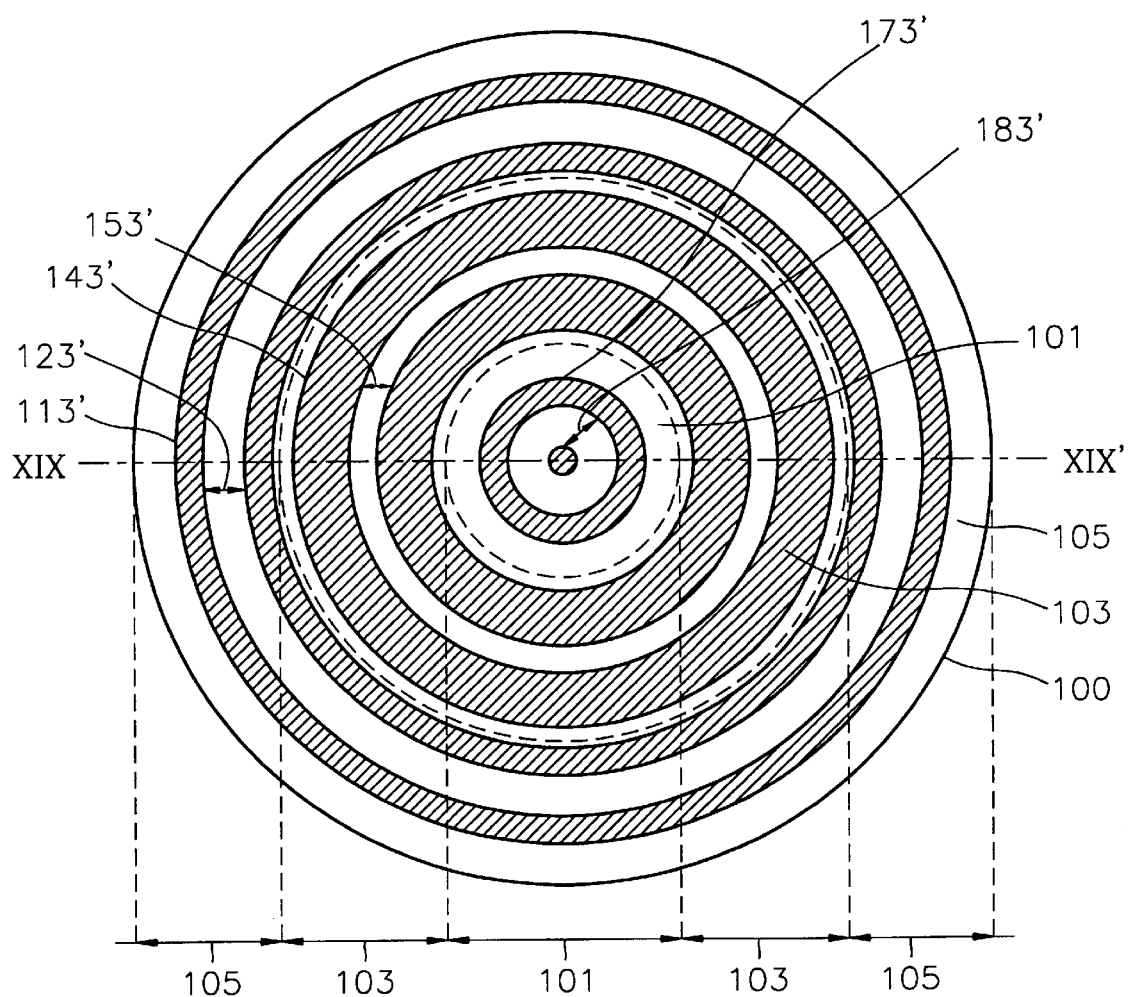
FIG. 18 is a plan view of the ninth embodiment of a polishing pad according to the present invention.
Figure 19:
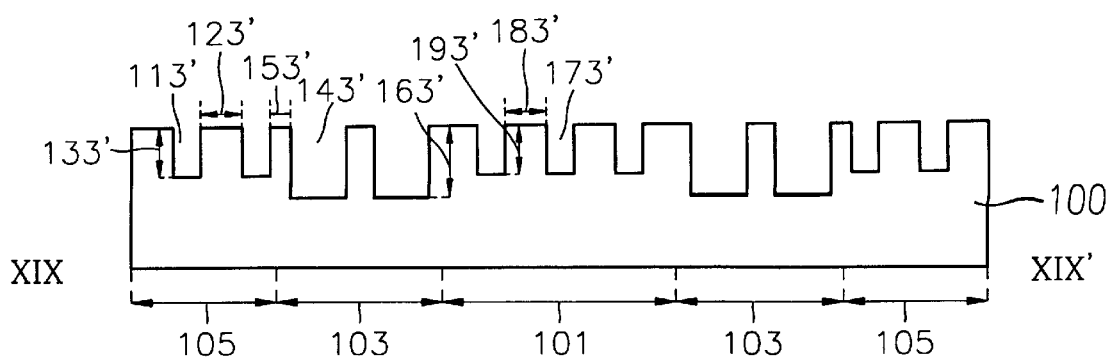
FIG. 19 is a cross-sectional view of the ninth embodiment of the polishing pad taken along line XIX–XIX' in FIG. 18.

FIGS. 18 and 19 are a plan view and a sectional view, respectively, of a ninth embodiment of the polishing pad according to the present invention.

In the ninth embodiment, a plurality of second grooves 113' having a second depth 133', a second width and a second spacing 123' are formed in the second polishing region 105; a plurality of first grooves 143' having a first depth 163', a first width and a first spacing 153' are formed in the first polishing region 103; and a plurality of third grooves 173' having a third depth 193', a third width and a third spacing 183' are formed in the third polishing region 105. The first grooves 143' are different from the second grooves 113' and the third grooves 173'.

For instance, the first grooves 143' are deeper than the second grooves 113' and/or the third grooves 173'. The first grooves 143' are also wider than the second grooves 113' and the third grooves 173'. The first spacing 153' is smaller than the second spacing 123' and the third spacing 183'. The number of first grooves 143' per unit area in the first polishing region 103 is greater than the number of second grooves 113' per unit area in the second polishing region 105 and the number of third grooves 173' per unit area in the third polishing region 101.

Figure 20:
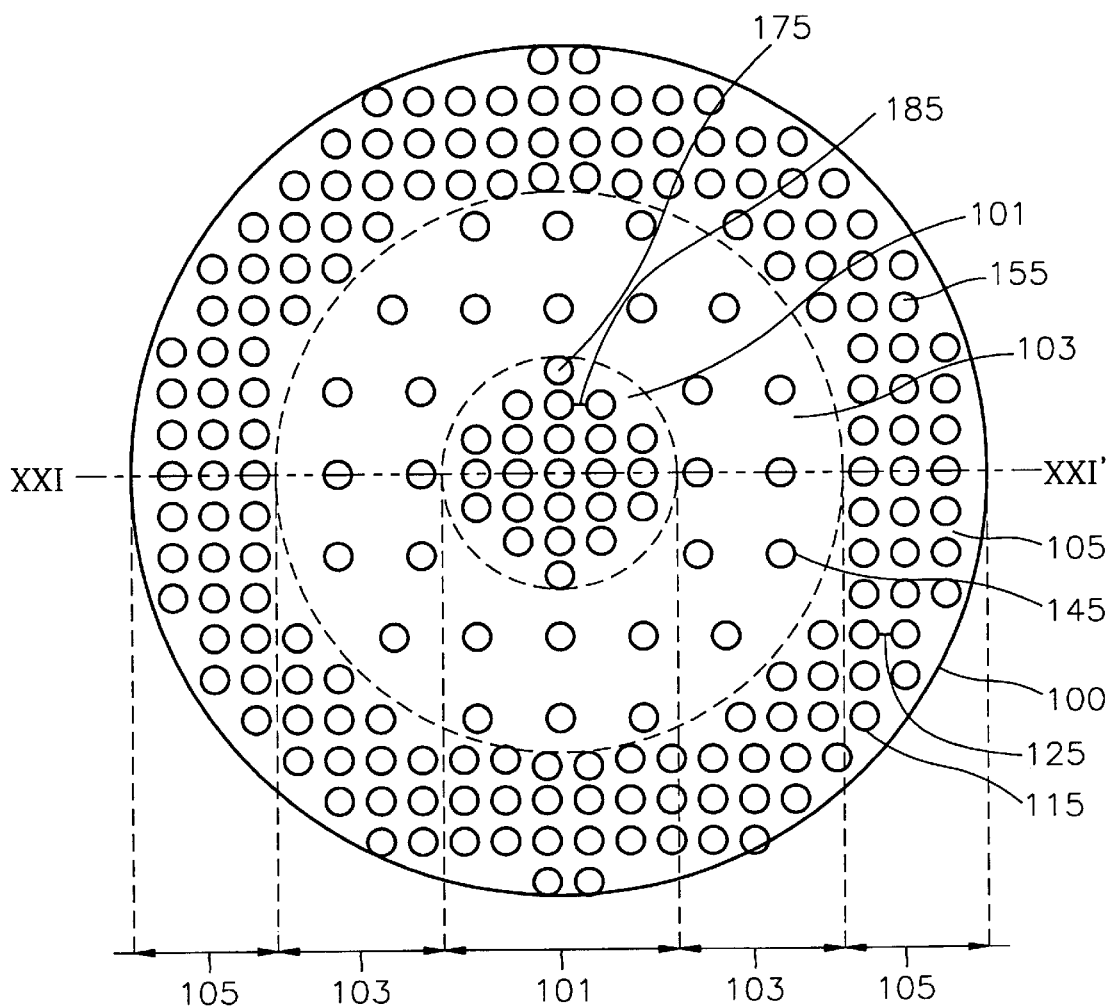
FIG. 20 is a plan view of the tenth embodiment of a polishing pad according to the present invention.
Figure 21:
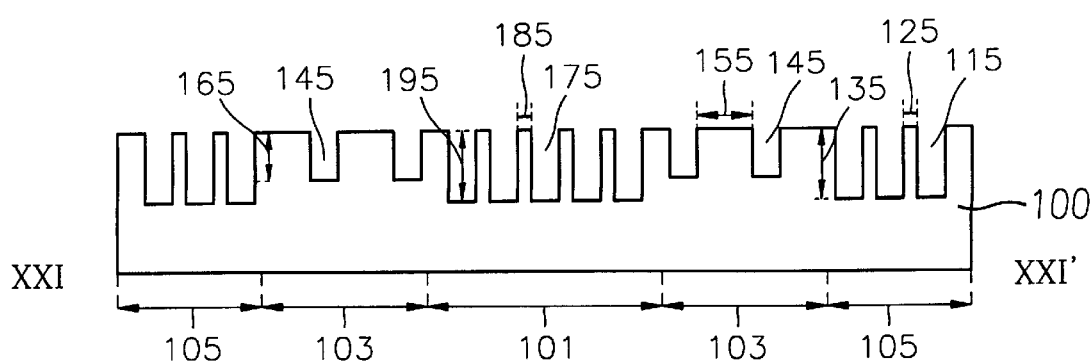
FIG. 21 is a cross-sectional view of the tenth embodiment of the polishing pad taken along line XXI–XXI' in FIG. 20.

FIGS. 20 and 21 are a plan view and a sectional view, respectively, of a tenth embodiment of the polishing pad according to the present invention.

In the tenth embodiment, the depth 165 of the holes 145 in the first polishing region 103 is less than the depth 135 of the holes 115 in the second polishing region 105 and/or the depth 195 of the holes 175 in the third polishing region 101. The holes 145 are also narrower than the second holes 115 and the third holes 175. The first spacing 155 is greater than the second spacing 125 and the third spacing 185. The number of first holes 145 per unit area in the first polishing region is less than the number of holes 115 per unit area in the second polishing region and/or the number of holes 175 per unit area in the third polishing region. That is, the configuration of the holes in this embodiment is symmetrical to that of the sixth embodiment.

In the case where three discrete polishing regions are provided, the relative dimensions of the holes or grooves of the first polishing region 103, the second polishing region 105 and the third polishing region 101 may vary in accordance with anticipated problems in the irregularity of polishing the semiconductor substrate in the first polishing region.

For instance, the holes in the first polishing region 103 can be narrower than the holes in the second polishing region 105 and/or the holes in the third polishing region 101. Thus, the spacing of the holes in the first polishing region 103 can be greater than the holes in the second polishing region 105 or the holes in the third polishing region 101.

Also, in contrast to the eighth embodiment and the ninth embodiment, the grooves formed in the first polishing region 103 can be shallower than the grooves in the second polishing region 105 and/or the grooves in the third polishing region 101; the first grooves can be narrower than the second grooves and the third grooves; the first spacing can be greater than the second spacing or the third spacing; and the number of the first grooves per unit area of the first polishing region 103 can be less than the number of the second grooves per unit area of the second polishing region 105 and/or the number of the third grooves per unit area of the third polishing region 101.

Figure 22:
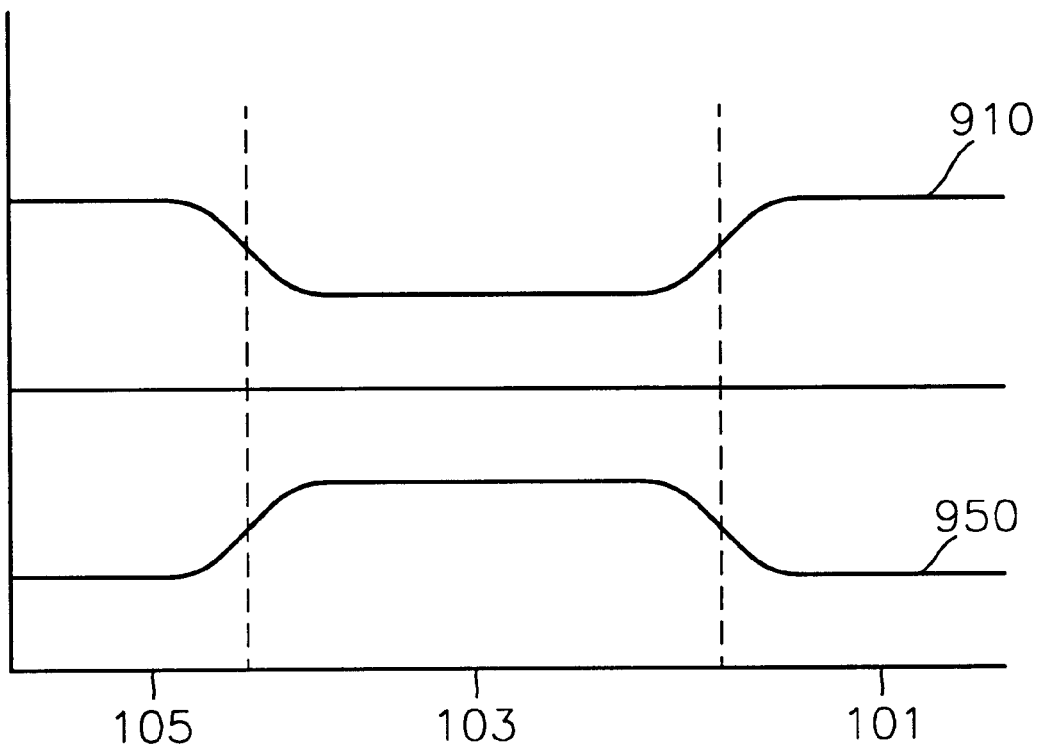
FIG. 22 is a graph showing characteristics of the each of the sixth through ninth embodiments of the polishing pad according to the present invention.

FIG. 22 shows the different polishing characteristics of the regions of the sixth through ninth embodiments of the polishing pad according to the present invention.

In FIG. 22, reference numeral 950 denotes the distribution of slurry in the respective polishing regions, whereas reference numeral 910 denotes the amount of contact area in the respective polishing regions. The diagram thus shows more slurry supplied to the first polishing region 103 than each of the second 105 and third 101 polishing regions, and less of a contact area existing in the first polishing region 103 than in the second 105 and third 101 polishing regions. On the other hand, as is illustrated by the tenth embodiment, the regions of the polishing pad can be characterized so that less slurry is supplied to the first polishing region 103 than to each of the second 105 and third 101 polishing regions, and less of a contact area exists in the first polishing region 103 than in the second 105 and third 101 polishing regions.

As described above, a polishing pad in which the amount of polishing effected at the second polishing region 105 and at the third polishing region 101 is greater than that effected by the first polishing region 103, is useful in the case in which a surface of a semiconductor substrate inherently wears more at the outer peripheral portion thereof than that at the center thereof. Conversely, a polishing pad in which the amount of polishing effected at the first polishing region 103 is greater than that effected at the second polishing region 105 and the third polishing region 101, is useful in the case in which the surface of the semiconductor substrate inherently wears less at the outer peripheral portion thereof than that at the center thereof.

For instance, when it is determined that the outer peripheral portion of the surface of the semiconductor substrate becomes relatively highly polished at the first polishing region 103, the outer peripheral portion is moved to a fixed position or is oscillated over the second polishing region 105 and/or the third polishing region 101 by the carrier 550 (of FIG. 1). In this case, the pad is of the type in which the second polishing region 105 and/or the third polishing region 101 effects less polishing than the first polishing region 103. Thus, the entire surface of the semiconductor substrate can become uniformly polished.

However, when it is determined that the outer peripheral portion of the surface of the semiconductor substrate will become less polished than the central portion thereof at the first polishing region 103, a pad of the type in which the second polishing region 105 and/or the third polishing region 101 effects more polishing than the first polishing region 103 is used. Thus, an insufficient amount of polishing of the outer peripheral portion of the substrate surface can be compensated for.

In summary, because the topology of at least two of the polishing regions is different, different contact pressures can be produced at the polishing regions, different amounts of slurry can be supplied to the substrate at the polishing regions, and/or different areas of contact exist at the polishing regions. Thus, differences in the amount of polishing will occur at the respective polishing regions.

It will be understood that the present invention is not limited to the embodiments described above. Many changes and modifications of the embodiments will become apparent to those skilled in the art. For instance, the polishing surface can take the form of protrusions whereby the slurry holding means becomes the recess defined at the base of the protrusions. Accordingly, all such changes and modifications are seen to be within the true spirit and scope of the invention as defined by the appended claims.

What is claimed is:

1. A method of polishing a semiconductor substrate, the method comprising:

fixing the semiconductor substrate to a semiconductor carrier;

attaching a polishing pad to a polishing table across from the semiconductor substrate, the polishing pad having a polishing surface facing a surface of the semiconductor substrate to be polished, the polishing surface having discrete first and second polishing regions disposed adjacent one another, with at least one opening in the first polishing region and at least one opening in the second polishing region, a ratio of total volume of the at least one opening in the first polishing region per unit area of the first polishing region being different from a ratio of total volume of the at least one opening in the second polishing region per unit area of the second polishing region;

subsequently pressing the surface of the semiconductor substrate against only the first polishing region of the polishing surface of the polishing pad;

introducing a slurry onto the polishing surface of the polishing pad so that the slurry occupies the openings in the polishing regions of the polishing pad;

rotating the polishing pad and the semiconductor substrate relative to one another while the surface of the semiconductor substrate is pressed against the first polishing region of the polishing surface of the polishing pad and the slurry occupies the at least one opening in the first polishing region, whereby the semiconductor substrate is polished;

determining whether there is an irregularity between an amount of polishing that is effected at a central portion and at an outer peripheral portion of the surface of the semiconductor substrate by the first polishing region of the polishing surface; and if an irregularity in the amount of polishing is determined, moving only the outer peripheral portion of the surface of the semiconductor substrate onto the second polishing region of the polishing surface of the polishing pad, and rotating the polishing pad and the semiconductor substrate relative to one another while the outer peripheral portion of the surface of the semiconductor substrate is pressed against the second polishing region and slurry occupies the at least one opening in the second polishing region, whereby the outer peripheral portion of the semiconductor substrate is polished at a different rate than when it was being polished by the first polishing region of the polishing surface of the polishing pad.

2. The method of polishing a semiconductor substrate of claim 1, wherein said moving of the semiconductor substrate comprises oscillating the semiconductor substrate in back and forth directions.

3. A polishing pad for use in polishing a semiconductor substrate, the polishing pad comprising:

a polishing surface at which a surface of the semiconductor substrate is polished, said polishing surface having discrete first and second polishing regions disposed adjacent one another;

a first slurry holder that holds slurry in said first polishing region; and a second slurry holder that holds slurry in said second polishing region, said first and second slurry holders respectively comprising at least one opening in said first and second polishing regions of said polishing surface, a ratio of total volume of the openings in said first polishing region per unit area of said first polishing region being different from a ratio of total volume of openings in said second polishing region per unit area of said second polishing regions, the at least one opening in said second polishing region being deeper than the at least one opening in said first polishing region.

4. The polishing pad of claim 1, wherein said first polishing region is entirely located radially inwardly of said second polishing region.

5. The polishing pad of claim 4, wherein said first polishing region extends between an end of a first line segment extending radially outwardly from a center of said polishing surface of the polishing pad and an end of a longer second line segment also extending radially outwardly from the center of said polishing surface of the polishing pad, and said second polishing region extends from the end of said second line segment to an end of a third line segment extending radially outwardly from the center of said polishing surface of the polishing pad to an outer peripheral edge of the polishing pad.

6. The polishing pad of claim 4, wherein the at least one opening in said second polishing region is narrower than the at least one opening in said first polishing region.

7. The polishing pad of claim 4, wherein said first and second slurry holders comprise a plurality of spaced apart openings formed in said first and second polishing regions of said polishing surface, respectively, the openings in said first polishing region being spaced further apart than the openings in said second polishing region.

8. The polishing pad of claim 3, wherein said first and second slurry holders comprise first and second holes formed in said first and second polishing regions of said polishing surface, respectively.

9. The polishing pad of claim 8, wherein a number of the second holes per unit area of said second polishing region is more than a number of the first holes per unit area of said first polishing region.

10. The polishing pad of claim 8, wherein a number of the second holes per unit area of said second polishing region is less than a number of the first holes per unit area of said first polishing region.

11. The polishing pad of claim 1, wherein said first and second slurry holders comprise first and second grooves formed in said first and second polishing regions of said polishing surface, respectively.

12. The polishing pad of claim 11, wherein a number of the second grooves per unit area of said second polishing region is more than a number of the first grooves per unit area of said first polishing region.

13. The polishing pad of claim 11, wherein a number of the second grooves per unit area of said second polishing region is less than a number of the first grooves per unit area of said first polishing region.

14. The polishing pad of claim 1, wherein the at least one opening in said second polishing region is wider than the at least one opening in said first polishing region.

15. The polishing pad of claim 1, wherein said first and second slurry holders comprise a plurality of spaced apart openings formed in said first and second polishing regions of said polishing surface, respectively, the openings in said first polishing region being spaced closer together than the openings in said second polishing region.

16. The polishing pad of claim 1, wherein said first and second slurry holders comprise a plurality of openings regularly spaced apart in said first and second polishing regions of said polishing surface, respectively.

17. The polishing pad of claim 1, wherein said polishing surface has a third polishing region discrete from said first and second polishing regions and disposed on an opposite side of said first polishing region from said second polishing region, said third polishing region comprising a third slurry holder that holds slurry, said third slurry holder comprising at least one opening formed in said third polishing region of said polishing surface, a ratio of total volume of openings per unit area in said third polishing region being different from a ratio of total volume of openings per unit area in said first polishing region.

18. The polishing pad of claim 17, wherein said first polishing region is entirely located radially inwardly of said second polishing region, and said third polishing region is entirely located radially inwardly of said first polishing region.

19. The polishing pad of claim 18, wherein said first polishing region extends between an end of a first line segment extending radially outwardly from a center of said polishing surface of the polishing pad and an end of a longer second line segment also extending radially outwardly from the center of said polishing surface of the polishing pad, and said second polishing region extends from the end of said second line segment to an end of a third line segment extending radially outwardly from the center of said polishing surface of the polishing pad to an outer peripheral edge of the polishing pad.

20. The polishing pad of claim 19, wherein the at least one opening in said third polishing region is narrower than the at least one opening in said first polishing region.

21. The polishing pad of claim 18, wherein said first and third slurry holders comprise a plurality of spaced apart openings in said first and third polishing regions of said polishing surface, respectively, the openings in said third polishing region being spaced further apart than the openings in said first polishing region.

22. The polishing pad of claim 17, wherein said third slurry holder is a plurality of holes formed in said third polishing region of said polishing surface.

23. The polishing pad of claim 22, wherein said first and second slurry holders comprise first and second holes formed in said first and second polishing regions of said polishing surface, respectively, and a number of holes per unit area of said first polishing region is more than a number of holes per unit area of said third polishing region.

24. The polishing pad of claim 22, wherein said first and second slurry holders comprise first and second holes formed in said first and second polishing regions of said polishing surface, respectively, and a number of holes per unit area of said first polishing region is less than a number of holes per unit area of said third polishing region.

25. The polishing pad of claim 17, wherein a number of openings per unit area of said first polishing region is more than a number of openings per unit area of said third polishing region.

26. The polishing pad of claim 17, wherein a number of openings per unit area of said first polishing region is less than a number of openings per unit area of said third polishing region.

27. The polishing pad of claim 17, wherein said third slurry holder comprises a plurality of grooves formed in said third polishing region of said polishing surface.

28. The polishing pad of claim 27, wherein said first and second slurry holders comprise first and second grooves formed in said first and second polishing regions of said polishing surface, respectively, and a number of the first grooves per unit area of said first polishing region is more than a number of the grooves in said third polishing region per unit area of said third polishing region.

29. The polishing pad of claim 27, wherein said first and second slurry holders comprise first and second grooves formed in said first and second polishing regions of said polishing surface, respectively, and a number of the first grooves per unit area of said first polishing region is less than a number of the grooves in said third polishing region per unit area of said third polishing region.

30. The polishing pad of claim 17, wherein the at least one opening in said third polishing region is wider than the at least one opening in said first polishing region.

31. The polishing pad of claim 17, wherein said first and third slurry holders comprise a plurality of spaced apart openings formed in said first and third polishing regions of said polishing surface, respectively, the openings in said third polishing region being spaced closer together than the openings in said first polishing region.

32. The polishing pad of claim 17, wherein said third slurry holder comprises a plurality of openings regularly spaced apart in said third polishing region of said polishing surface.

33. A polishing pad for a semiconductor substrate comprising:
   a first polishing region having a plurality of first openings in a surface of the polishing pad, the first openings holding a slurry;
   a second polishing region having a plurality of second openings in the surface of the polishing pad, the second openings holding the slurry; and
   a third polishing region having a plurality of third openings in the surface of the polishing pad, the third openings holding the slurry,
   the third polishing region being entirely located radially inward of the first polishing region and extending from an innermost radial position of the polishing pad and the first polishing region being entirely located radially inward of the second polishing region,
   a ratio of total volume of the third openings per unit area of the third region being greater than a ratio of total volume of the first openings per unit area in the first region and the ratio of total volume of the first openings per unit area in the first region being less than a ratio of the second openings per unit area in the second region.

34. The polishing pad of claim 33, wherein depths of the second and third openings are greater than a depth of the first openings.

35. A polishing pad for a semiconductor substrate comprising:
   a first polishing region having a plurality of first grooves in a surface of the polishing pad, the first grooves holding a slurry; and
   a second polishing region having a plurality of second grooves in the surface of the polishing pad, the second grooves holding the slurry,
   the first polishing region being entirely located inward of the second polishing region and extending from an innermost radial position of the polishing pad, a number of first grooves per unit area in the first region being greater than a number of second grooves per unit area in the second region.

36. The polishing pad of claim 35, wherein the first and second grooves are concentric.

37. The polishing pad of claim 35, wherein a depth of the first grooves is less than a depth of the second grooves.

38. A polishing pad for use in polishing a semiconductor substrate, the polishing pad comprising:
   a polishing surface at which a surface of the semiconductor substrate is polished, said polishing surface having discrete first and second polishing regions disposed adjacent one another;
   a first slurry holder that holds slurry in said first polishing region; and
   a second slurry holder that holds slurry in said second polishing region,
   said first and second slurry holders respectively comprising at least one opening in said first and second polishing regions of said polishing surface, a ratio of total volume of the openings in said first polishing region per unit area of said first polishing region being different from a ratio of total volume of openings in said second polishing region per unit area of said second polishing region,
   said first polishing region being entirely located radially inwardly of said second polishing region and the at least one opening in said second polishing region being shallower than the at least one opening in said first polishing region.

39. A polishing pad for use in polishing a semiconductor substrate, the polishing pad comprising:
   a polishing surface at which a surface of the semiconductor substrate is polished, said polishing surface having discrete first and second polishing regions disposed adjacent one another;
   a first slurry holder that holds slurry in said first polishing region; and
   a second slurry holder that holds slurry in said second polishing region,
   said first and second slurry holders respectively comprising a plurality of openings regularly spaced apart in said first and second polishing regions of said polishing surface, a ratio of total volume of the openings in said first polishing region per unit area of said first polishing region being different from a ratio of total volume of openings in said second polishing region per unit area of said second polishing region,
   the plurality of openings in said first polishing region have a depth, width and spacing that are different from a depth, width and spacing of the plurality of openings in said second polishing region.

40. A polishing pad for use in polishing a semiconductor substrate, the polishing pad comprising:
   a polishing surface at which a surface of the semiconductor substrate is polished, said polishing surface having discrete first and second polishing regions disposed adjacent one another;
   a first slurry holder that holds slurry in said first polishing region; and
   a second slurry holder that holds slurry in said second polishing region,
   said first and second slurry holders respectively comprising at least one opening in said first and second polishing regions of said polishing surface, a ratio of total volume of the openings in said first polishing region per unit area of said first polishing region being different from a ratio of total volume of openings in said second polishing region per unit area of said second polishing region, said polishing surface has a third polishing region discrete from said first and second polishing regions and disposed on an opposite side of said first polishing region from said second polishing region, said third polishing region comprising a third slurry holder that holds slurry, said third slurry holder comprising at least one opening formed in said third polishing region of said polishing surface, a ratio of total volume of openings per unit area in said third polishing region being different from a ratio of total volume of openings per unit area in said first polishing region, the at least one opening in said third polishing region being deeper than the at least one opening in said first polishing region.

41. A polishing pad for use in polishing a semiconductor substrate, the polishing pad comprising:

a polishing surface at which a surface of the semiconductor substrate is polished, said polishing surface having discrete first and second polishing regions disposed adjacent one another;

a first slurry holder that holds slurry in said first polishing region; and a second slurry holder that holds slurry in said second polishing region, said first and second slurry holders respectively comprising at least one opening in said first and second polishing regions of said polishing surface, a ratio of total volume of the openings in said first polishing region per unit area of said first polishing region being different from a ratio of total volume of openings in said second polishing region per unit area of said second polishing region, said polishing surface has a third polishing region discrete from said first and second polishing regions and disposed on an opposite side of said first polishing region from said second polishing region, said third polishing region comprising a third slurry holder that holds slurry, said third slurry holder comprising at least one opening formed in said third polishing region of said polishing surface, a ratio of total volume of openings per unit area in said third polishing region being different from a ratio of total volume of openings per unit area in said first polishing region, said first polishing region is entirely located radially inwardly of said second polishing region, and said third polishing region is entirely located radially inwardly of said first polishing region, the at least one opening in said third polishing region being shallower than the at least one opening in said first polishing region.

42. A polishing pad for use in polishing a semiconductor substrate, the polishing pad comprising:

a polishing surface at which a surface of the semiconductor substrate is polished, said polishing surface having discrete first and second polishing regions disposed adjacent one another;

a first slurry holder that holds slurry in said first polishing region; and a second slurry holder that holds slurry in said second polishing region, said first slurry holder comprising a plurality of openings regularly spaced apart in said first polishing region of said polishing surface and said second slurry holder comprising at least one opening in said second polishing region of said polishing surface, a ratio of total volume of the openings in said first polishing region per unit area of said first polishing region being different from a ratio of total volume of openings in said second polishing region per unit area of said second polishing region, said polishing surface has a third polishing region discrete from said first and second polishing regions and disposed on an opposite side of said first polishing region from said second polishing region, said third polishing region comprising a third slurry holder that holds slurry, said third slurry holder comprising a plurality of openings regularly spaced apart in said third polishing region of said polishing surface, a ratio of total volume of openings per unit area in said third polishing region being different from a ratio of total volume of openings per unit area in said first polishing region, the plurality of openings in said third polishing region have a depth, width and spacing that are different from a depth, width and spacing of the plurality of openings in said first polishing region.

43. A polishing pad for use in polishing a semiconductor substrate, the polishing pad comprising:

a polishing surface at which a surface of the semiconductor substrate is polished, said polishing surface having discrete first and second polishing regions disposed adjacent one another;

a first slurry holder that holds slurry in said first polishing region; and a second slurry holder that holds slurry in said second polishing region, said first and second slurry holders respectively comprising a plurality of openings regularly spaced apart in said first and second polishing regions of said polishing surface, a ratio of total volume of the openings in said first polishing region per unit area of said first polishing region being different from a ratio of total volume of openings in said second polishing region per unit area of said second polishing region, said polishing surface has a third polishing region discrete from said first and second polishing regions and disposed on an opposite side of said first polishing region from said second polishing region, said third polishing region comprising a third slurry holder that holds slurry, said third slurry holder comprising a plurality of openings regularly spaced apart in said third polishing region of said polishing surface, a ratio of total volume of openings per unit area in said third polishing region being different from a ratio of total volume of openings per unit area in said first polishing region, the plurality of openings in said first polishing region have a depth, width and spacing that are different from a depth, width and spacing of the plurality of openings in said second polishing region, and the plurality of openings in said third polishing region have a depth, width and spacing that are different from the depth, width and spacing of the plurality of openings in said first polishing region.

* * * * *